(12) United States Patent
Rasheed et al.

(10) Patent No.: US 9,689,070 B2
(45) Date of Patent: *Jun. 27, 2017

(54) DEPOSITION RING AND ELECTROSTATIC CHUCK FOR PHYSICAL VAPOR DEPOSITION CHAMBER

(71) Applicant: Applied Materials, Inc., Santa Clara, CA (US)

(72) Inventors: Muhammad Rasheed, San Jose, CA (US); Keith A. Miller, Mountain View, CA (US); Rongjun Wang, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/216,389

(22) Filed: Jul. 21, 2016

(65) Prior Publication Data

US 2016/0340775 A1 Nov. 24, 2016

Related U.S. Application Data

(60) Continuation of application No. 13/662,380, filed on Oct. 26, 2012, now abandoned, which is a division of
(Continued)

(51) Int. Cl.
*C23C 14/34* (2006.01)
*C23C 14/50* (2006.01)
(Continued)

(52) U.S. Cl.
CPC .......... *C23C 14/50* (2013.01); *C23C 14/3407* (2013.01); *C23C 14/564* (2013.01); *C23C 16/4585* (2013.01); *H01L 21/68735* (2013.01)

(58) Field of Classification Search
CPC . C23C 14/50; C23C 14/3407; C23C 16/4585; H01L 21/68735
See application file for complete search history.

(56) References Cited

U.S. PATENT DOCUMENTS 5,262,029 A  11/1993 Erskine et al.
5,513,594 A  5/1996 McClanahan et al.
(Continued)

FOREIGN PATENT DOCUMENTS

CN  101563560 A  10/2009
WO  2012/057987 A2  5/2012

OTHER PUBLICATIONS

PCT international search report and written opinion of PCT/US2011/055374 dated May 4, 2012.
(Continued)

*Primary Examiner* — John Brayton
(74) *Attorney, Agent, or Firm* — Patterson + Sheridan, LLP

(57) ABSTRACT

Embodiments of the invention generally relate to a process kit for a semiconductor processing chamber, and a semiconductor processing chamber having a kit. More specifically, embodiments described herein relate to a process kit including a deposition ring and a pedestal assembly. The components of the process kit work alone, and in combination, to significantly reduce their effects on the electric fields around a substrate during processing.

13 Claims, 6 Drawing Sheets

Related U.S. Application Data application No. 13/280,771, filed on Oct. 25, 2011, now Pat. No. 8,911,601.

(60) Provisional application No. 61/407,984, filed on Oct. 29, 2010.

(51) Int. Cl.
  *C23C 16/458* (2006.01)
  *C23C 14/56* (2006.01)
  *H01L 21/687* (2006.01)

(56) References Cited

U.S. PATENT DOCUMENTS

| | | | |
|---|---|---|---|
| 5,538,603 A | 7/1996 | Guo et al. | |
| 5,605,866 A | 2/1997 | McClanahan et al. | |
| 5,736,021 A | 4/1998 | Ding et al. | |
| 5,985,033 A | 11/1999 | Yudovsky et al. | |
| 6,034,863 A | 3/2000 | Marohl et al. | |
| 6,270,862 B1 | 8/2001 | McMillin et al. | |
| 6,364,957 B1 | 4/2002 | Schneider et al. | |
| 6,630,201 B2 | 10/2003 | Chiang et al. | |
| 6,723,214 B2 | 4/2004 | Stimson et al. | |
| 7,163,607 B2 | 1/2007 | Stimson et al. | |
| 7,255,898 B2 | 8/2007 | O'Donnell et al. | |
| 7,981,262 B2 * | 7/2011 | Pavloff | H01J 37/32477 118/720 |
| 8,911,601 B2 * | 12/2014 | Rasheed | C23C 14/50 118/500 |
| 2002/0104751 A1 | 8/2002 | Drewery et al. | |
| 2006/0090706 A1 | 5/2006 | Miller et al. | |
| 2007/0102286 A1 | 5/2007 | Scheible et al. | |
| 2007/0283884 A1 | 12/2007 | Tiller et al. | |
| 2008/0141942 A1 * | 6/2008 | Brown | C23C 14/564 118/723 R |
| 2008/0178801 A1 | 7/2008 | Pavloff et al. | |
| 2009/0050272 A1 | 2/2009 | Rosenberg et al. | |
| 2009/0260982 A1 | 10/2009 | Riker et al. | |
| 2009/0272647 A1 | 11/2009 | Young et al. | |

OTHER PUBLICATIONS

Chinese Office Action dated Apr. 22, 2015 for Application No. 201180045703.0.

\* cited by examiner

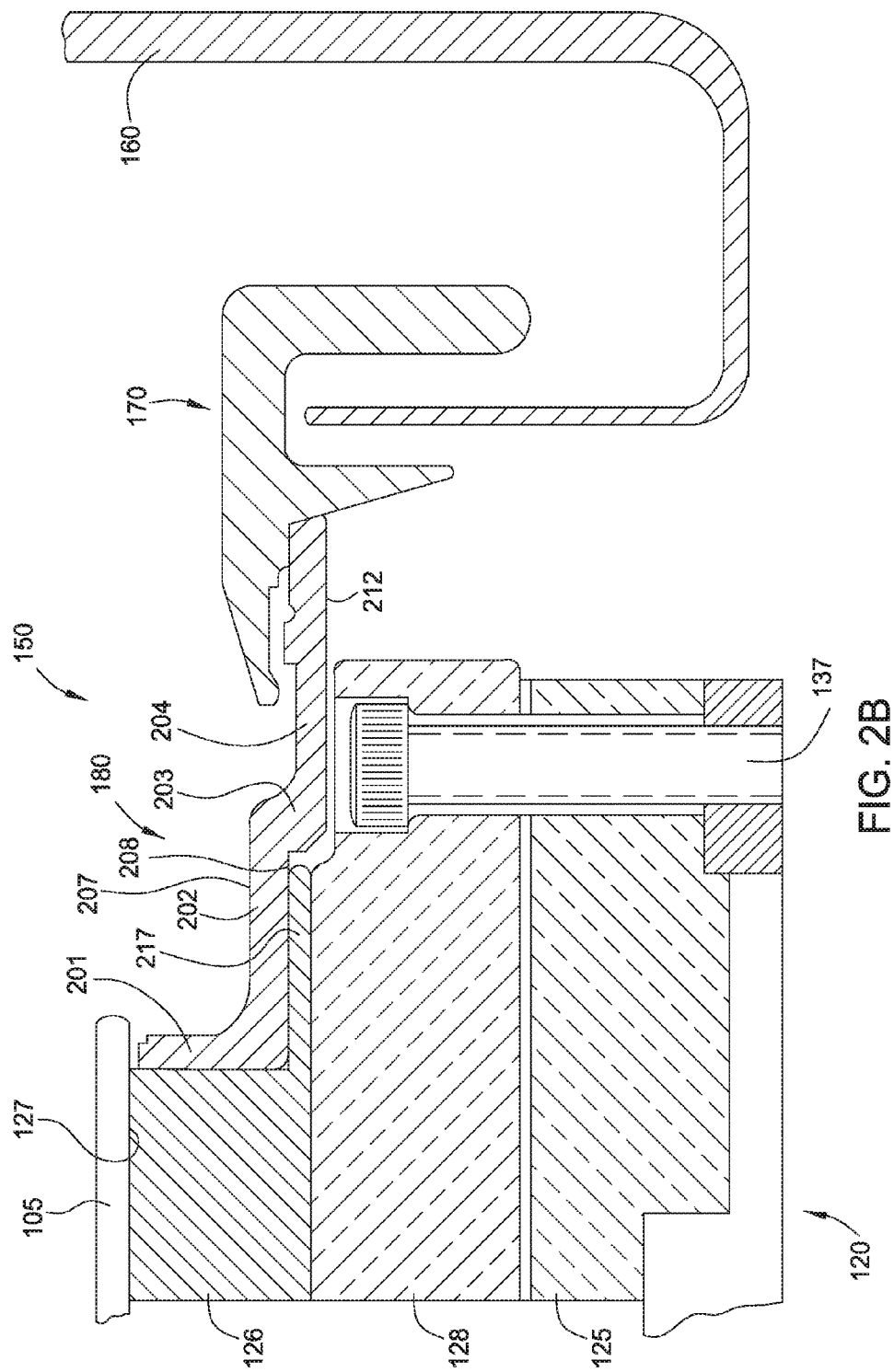

DEPOSITION RING AND ELECTROSTATIC CHUCK FOR PHYSICAL VAPOR DEPOSITION CHAMBER

CROSS-REFERENCE TO RELATED APPLICATION

This is a continuation application of U.S. patent application Ser. No. 13/662,380, filed Oct. 26, 2012, which is a divisional application of U.S. patent application Ser. No. 13/280,771, filed Oct. 25, 2011, which claims benefit of U.S. Provisional Patent Application Ser. No. 61/407,984, filed Oct. 29, 2010, all of which are incorporated by reference in their entireties.

BACKGROUND OF THE INVENTION

Field of the Invention

Embodiments of the invention generally relate to an electrostatic chuck and process kit for a semiconductor processing chamber, and a semiconductor processing chamber having a process kit. More specifically, embodiments of the invention relate to a process kit including at least a deposition ring used in a physical vapor deposition chamber. Other embodiments relate to a deposition ring for use with a flangeless electrostatic chuck and processing chamber having the same.

Description of the Related Art

Physical vapor deposition (PVD), or sputtering, is one of the most commonly used processes in the fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate support pedestal disposed within the chamber.

An electrostatic chuck (ESC) may be used to support and retain substrates within the processing chamber during processing. The ESC typically includes a ceramic puck having one or more electrodes therein. A chucking voltage is applied to the electrodes to electrostatically hold the substrate to the ESC. Further information on ESC's can be found in U.S. Pat. No. 5,909,355, issued Jun. 1, 1999.

A process kit may be disposed in the chamber to help define a processing region in a desired region within the chamber with respect to the substrate. The process kit typically includes a cover ring, a deposition ring, and a ground shield. Confining the plasma and the ejected atoms to the processing region helps maintain other components in the chamber free from deposited materials and promotes more efficient use of target materials, as a higher percentage of the ejected atoms are deposited on the substrate.

Although conventional ring and shield designs have a robust processing history, improvements in film uniformity and throughput are constantly desired. Existing process kit designs position components in close proximity to the substrates during processing. The close proximity of the process kit components can affect the electric fields around the substrates and alter the uniformity of the films being deposited near the edge of the substrates.

Therefore, there is a need in the art for an improved process kit.

SUMMARY OF THE INVENTION

Embodiments of the invention generally provide a process kit for use in a physical vapor deposition (PVD) chamber and a PVD chamber having a process kit.

In one embodiment, a deposition ring is provided for use in a substrate processing chamber. The deposition ring generally includes a first cylinder, a first annular ring, a second cylinder, and a second annular ring. The first cylinder has a first and second end, and the second end is coupled to a portion of a top surface of the first annular ring adjacent an inner diameter of the first annular ring. The second cylinder has a first and second end. The first end of the second cylinder is coupled to a portion of a bottom surface of the first annular ring adjacent an outer diameter of the first annular ring. The second end of the second cylinder is coupled to a top surface of the second annular ring near an inner diameter of the second annular ring. A distance between the first and second ends of the first cylinder is at least a third of a distance between the first end of the first cylinder and the bottom surface of the second annular ring.

In another embodiment, a process kit for use in a substrate processing chamber is provided and includes a deposition ring and a pedestal assembly. The deposition ring generally includes a first cylinder, a first annular ring, a second cylinder, and a second annular ring. The first cylinder has a first and second end, and the second end is coupled to a portion of a top surface of the first annular ring adjacent an inner diameter of the first annular ring. The second cylinder has a first and second end. The first end of the second cylinder is coupled to a portion of a bottom surface of the first annular ring adjacent an outer diameter of the first annular ring. The second end of the second cylinder is coupled to a top surface of the second annular ring near an inner diameter of the second annular ring. A distance between the first and second ends of the first cylinder is at least a third of a distance between the first end of the first cylinder and the bottom surface of the second annular ring. The pedestal assembly is disposed within the substrate processing chamber. The pedestal assembly includes a substrate support coupled to a base plate. The first cylinder of the deposition ring has a diameter larger than a diameter of the substrate support. The distance between the first and second ends of the first cylinder is at least half of a thickness of the substrate support. The deposition ring is supported on the pedestal assembly.

In another embodiment, a ground shield is provided for use in a substrate processing chamber. The ground shield generally includes an outer cylindrical ring connected by a base to an inner cylindrical ring. The outer cylindrical ring has substantially vertical inner wall and a substantially vertical outer wall.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2B illustrates a partial cross-section of another embodiment of a process kit.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide a process kit for use in a physical deposition (PVD) chamber. In one embodiment, the process kit has reduced effects on the electric fields within the process cavity, which promotes greater process uniformity and repeatability.

Figure 1:
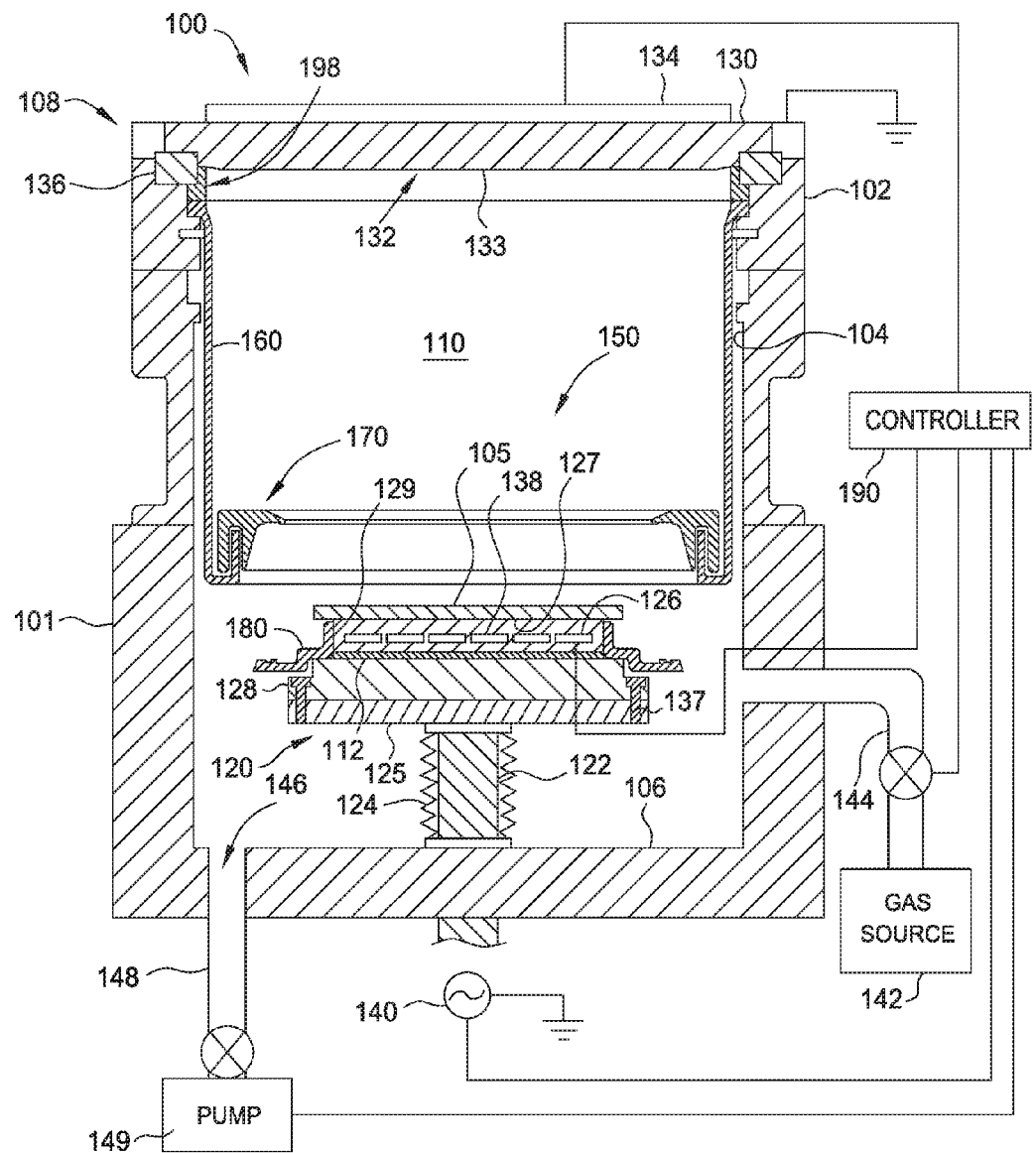
FIG. 1 is a simplified cross-sectional view of a semiconductor processing system having one embodiment of a process kit.

FIG. 1 depicts an exemplary semiconductor processing chamber 100 having one embodiment of a process kit 150 capable of processing a substrate 105. The process kit 150 includes at least a deposition ring 180 supported on a pedestal assembly 120, and may also include a one-piece ground shield 160 and an interleaving cover ring 170. In the version shown, the processing chamber 100 comprises a sputtering chamber, also called a physical vapor deposition or PVD chamber, capable of depositing metal or ceramic materials, such as for example, titanium, aluminum oxide, aluminum, copper, tantalum, tantalum nitride, tantalum carbide, tungsten, tungsten nitride, lanthanum, lanthanum oxides, titanium nitride, nickel, and NiPt, among others. One example of a processing chamber that may be adapted to benefit from the invention is the ALPS® Plus and SIP ENCORE® PVD processing chambers, available from Applied Materials, Inc. of Santa Clara, Calif. It is contemplated that other processing chambers including those from other manufacturers may be adapted to benefit from the invention.

The processing chamber 100 includes a chamber body 101 having upper adapters 102 and lower adapters 104, a chamber bottom 106, and a lid assembly 108 that enclose an interior volume 110 or plasma zone. The chamber body 101 is typically fabricated by machining and welding plates of stainless steel or by machining a single mass of aluminum. In one embodiment, the lower adapters 104 comprise aluminum and the chamber bottom 106 comprises stainless steel. The chamber bottom 106 generally contains a slit valve (not shown) to provide for entry and egress of a substrate 105 from the processing chamber 100. The lid assembly 108 of the processing chamber 100 in cooperation with the ground shield 160 that interleaves with the cover ring 170 confines a plasma formed in the interior volume 110 to the region above the substrate.

The pedestal assembly 120 is supported from the chamber bottom 106 of the chamber 100. The pedestal assembly 120 supports the deposition ring 180 along with the substrate 105 during processing. The pedestal assembly 120 is coupled to the chamber bottom 106 of the chamber 100 by a lift mechanism 122 that is configured to move the pedestal assembly 120 between an upper and lower position. Additionally, in the lower position, lift pins (not shown) are moved through the pedestal assembly 120 to space the substrate from the pedestal assembly 120 to facilitate exchange of the substrate with a wafer transfer mechanism disposed exterior to the processing chamber 100, such as a single blade robot (not shown). A bellows 124 is typically disposed between the pedestal assembly 120 and the chamber bottom 106 to isolate the interior volume 110 of the chamber body 101 from the interior of the pedestal assembly 120 and the exterior of the chamber.

Figure 2A:
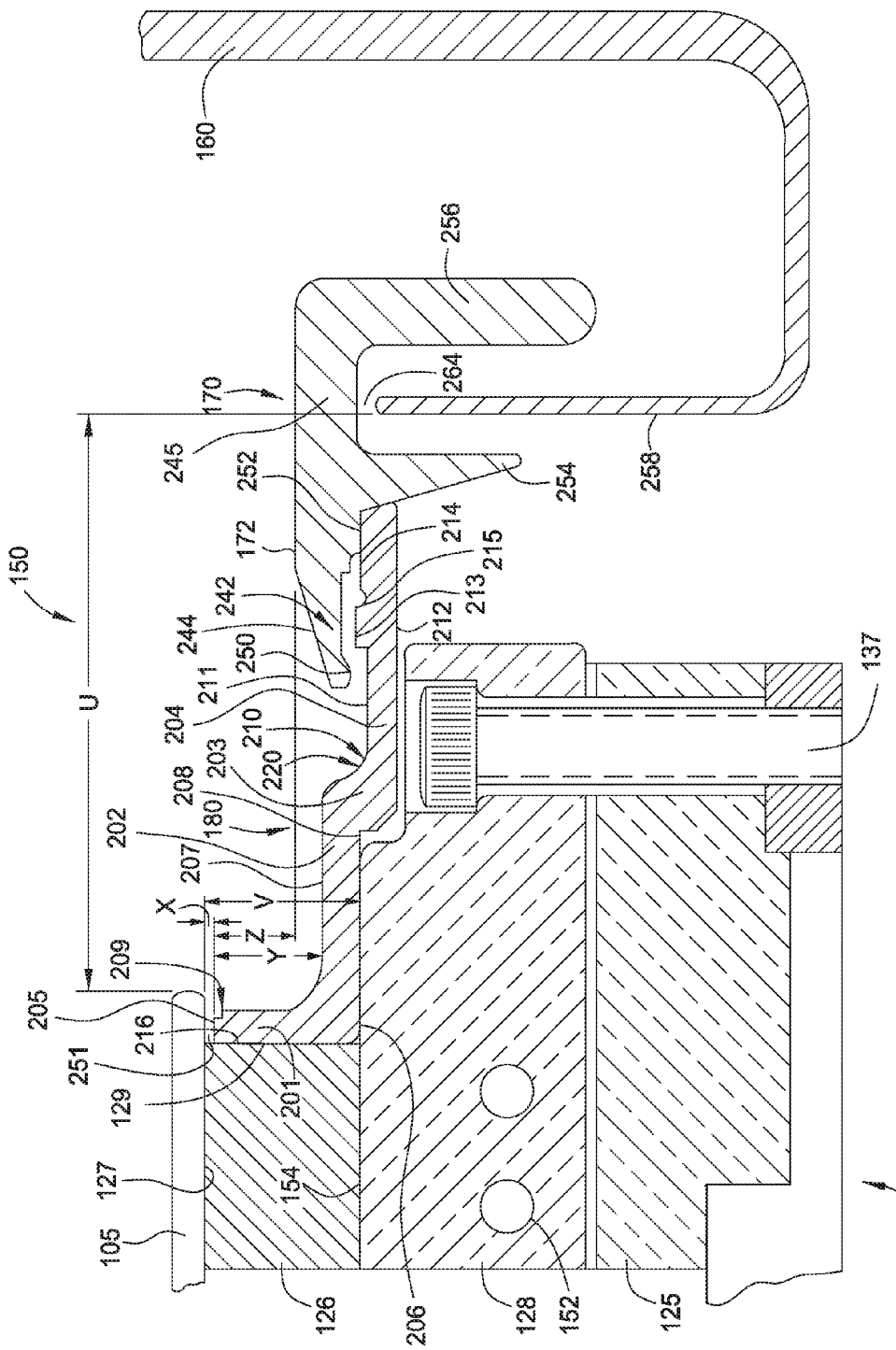
FIG. 2A illustrates a partial cross-section of the process kit of FIG. 1.

The pedestal assembly 120 generally includes a substrate support 126 sealingly coupled to a base plate 128 which is coupled to a ground plate 125. The substrate support 126 may be comprised of aluminum or ceramic. The substrate support 126 may be an electrostatic chuck, a ceramic body, a heater or a combination thereof. In one embodiment, the substrate support 126 is an electrostatic chuck that includes a dielectric body having electrodes 138 embedded therein. The dielectric body is typically fabricated from a high thermal conductivity dielectric material such as pyrolytic boron nitride, aluminum nitride, silicon nitride, alumina or an equivalent material. As shown in FIG. 2A, the substrate support 126 has a bottom surface 154. The vertical distance "V" between the bottom surface 154 and the substrate receiving surface 127 is between about, such as between about 0.30 to about 0.75 inches (about 0.76 to about 1.91 centimeter), for example 0.25 inches (0.64 centimeter). Returning to FIG. 1, in one embodiment, the substrate support 126 is attached to the base plate 128 by a metal foil 112, such as an aluminum foil, which diffusion bonds the base plate 128 and the substrate support 126.

The base plate 128 may comprise a material having thermal properties that are suitably matched to the overlying substrate support 126. For example, the base plate 128 can comprise a composite of ceramic and metal, such as aluminum silicon carbide, which provides better strength and durability than ceramic alone and also has good heat transfer properties. The composite material has a thermal expansion coefficient that is matched to the material of the substrate support 126 to reduce thermal expansion mismatch. In one version, the composite material comprises a ceramic having pores that are infiltrated with a metal, which at least partially fills the pores to form a composite material. The ceramic may comprise, for example, at least one of silicon carbide, aluminum nitride, aluminum oxide or cordierite. The ceramic may comprise a pore volume of from about 20 to about 80 volume % of the total volume, the remainder volume being of the infiltrated metal. The infiltrated metal can comprise aluminum with added silicon and may also contain copper. In another version, the composite may comprise a different composition of a ceramic and metal, such as metal having dispersed ceramic particles; or the base plate 128 can be made from only a metal, such as stainless steel or aluminum. A cooling plate (not shown) is generally disposed within the base plate 128 to thermally regulate the substrate support 126, but may also be disposed within the ground plate 125.

The ground plate 125 is typically fabricated from a metallic material such as stainless steel or aluminum. The base plate 128 may be coupled to the ground plate by a plurality of connectors 137. The connectors 137 may be one of a bolt, screw, key, or any other type of connector. The base plate 128 may be removable from the ground plate 125 for facilitating easier replacement and maintenance of the substrate support 126 and base plate 128.

The substrate support 126 has a substrate receiving surface 127 that receives and supports the substrate 105 during processing, the surface 127 having a plane substantially parallel to a sputtering surface 133 of the target 132. The substrate support 126 also has a peripheral edge 129 that terminates before an overhanging edge of the substrate 105.

The peripheral edge 129 of the substrate support 126 has a diameter between about 275 mm to about 300 mm. As discussed above, the substrate support 126 is taller than conventional support, having a height greater than about 0.25 inches (about 0.64 centimeter), such as between about 0.30 to about 0.75 inches (about 0.76 to about 1.91 centimeter). The relatively tall height of the substrate support 126 beneficially spaces the substrate vertically from the horizontal surfaces of a deposition ring 180 of a process kit 150, as further described below.

The lid assembly 108 generally includes a target backing plate 130, a target 132, and a magnetron 134. The target backing plate 130 is supported by the upper adapters 102 when in a closed position, as shown in FIG. 1. A ceramic ring seal 136 is disposed between the target backing plate 130 and upper adapters 102 to prevent vacuum leakage therebetween.

The target 132 is coupled to the target backing plate 130 and exposed to the interior volume 110 of the processing chamber 100. The target 132 provides material which is deposited on the substrate during a PVD process. An isolator ring 198 is disposed between the target 132, target backing plate 130, and chamber body 101 to electrically isolate the target 132 from the target backing plate 130 and the upper adapter 102 of the chamber body 101.

The target 132 is biased with RF and/or DC power relative to ground, e.g. the chamber body 101, by a power source 140. A gas, such as argon, is supplied to the interior volume 110 from a gas source 142 via conduits 144. The gas source 142 may comprise a non-reactive gas such as argon or xenon, which is capable of energetically impinging upon and sputtering material from the target 132. The gas source 142 may also include a reactive gas, such as one or more of an oxygen-containing gas, a nitrogen-containing gas, a methane-containing gas, that are capable of reacting with the sputtering material to form a layer on a substrate. Spent process gas and byproducts are exhausted from the chamber 100 through exhaust ports 146 that receive spent process gas and direct the spent process gas to an exhaust conduit 148 having a throttle valve to control the pressure of the gas in the chamber 100. The exhaust conduit 148 is connected to one or more exhaust pumps 149. Typically, the pressure of the sputtering gas in the chamber 100 is set to sub-atmospheric levels, such as a vacuum environment, for example, gas pressures of 0.6 mTorr to 400 mTorr. A plasma is formed from the gas between the substrate 105 and the target 132. Ions within the plasma are accelerated toward the target 132 and cause material to become dislodged from the target 132. The dislodged target material is deposited on the substrate.

The magnetron 134 is coupled to the target backing plate 130 on the exterior of the processing chamber 100. One magnetron which may be utilized is described in U.S. Pat. No. 5,953,827, issued Sep. 21, 1999 to Or et al., which is hereby incorporated by reference in its entirety.

Processes performed in the chamber 100 are controlled by a controller 190 that comprises program code having instruction sets to operate components of the chamber 100 to facilitate processing of substrates in the chamber 100. For example, the controller 190 can comprise program code that includes a substrate positioning instruction set to operate the pedestal assembly 120; a gas flow control instruction set to operate gas flow control valves to set a flow of sputtering gas to the chamber 100; a gas pressure control instruction set to operate a throttle valve to maintain a pressure in the chamber 100; a temperature control instruction set to control a temperature control system (not shown) in the pedestal assembly 120 or lower adapter 104 to set temperatures of the substrate or lower adapters 104, respectively; and a process monitoring instruction set to monitor the process in the chamber 100.

The process kit 150 comprises various components that can be easily removed from the chamber 100, for example, to clean sputtering deposits off the component surfaces, replace or repair eroded components, or to adapt the chamber 100 for other processes. In one embodiment, the process kit 150 includes at least the deposition ring 180, but may also include the ground shield 160 and the cover ring 170. In one embodiment, the cover ring 170 and deposition ring 180 are placed about the peripheral edge 129 of the substrate support 126.

The ground shield 160 is supported by the chamber body 101 and encircles the sputtering surface 133 of a sputtering target 132 that faces the substrate support 126. The ground shield 160 also surrounds the peripheral edge 129 of the substrate support 126. The ground shield 160 covers and shadows the lower adapters 104 of the chamber 100 to reduce deposition of sputtering deposits originating from the sputtering surface 133 of the sputtering target 132 onto the components and surfaces behind the ground shield 160.

FIG. 2A is a partial sectional view of the process kit 150 disposed around the pedestal assembly 120, illustrating the deposition ring 180, cover ring 170 and ground shield 160 in greater detail. The deposition ring 180 generally includes a first cylinder 201, a first annular ring 202, a second cylinder 203, and a second annular ring 204. The first cylinder 201, first annular ring 202, second cylinder 203, and second annular ring 204 may be formed as a unitary structure. The deposition ring 180 may be fabricated from a ceramic or metal material, such as quartz, aluminum oxide, stainless steel, titanium or other suitable material. The first cylinder 201 has a substantially vertical inner wall 216 that circumscribes the peripheral edge 129 of the substrate support 126. In one embodiment, the substrate support 126 has a diameter between 275 mm and 300 mm, such as about 280 mm to 295 mm. The first cylinder 201 has a diameter and thickness such that an outer diameter of the first cylinder 201 does not substantially protrude past an overhanging edge of the substrate 105. For example, the first cylinder 201 may have an inner diameter between 280 mm and 305 mm, such as about 290 mm to 300 mm. In another embodiment the inner wall 216 of the first cylinder may have a diameter of about 11.615 inches to about 11.630 inches (about 295 mm). The first cylinder 201 may have an outside diameter of about 11.720 to about 11.890 inches (about 302 mm). The first cylinder 201 may have a thickness between about 0.071 to about 0.625 inches (about 0.18 to about 1.59 centimeter), for example 0.29 inches (0.74 centimeter). The first cylinder 201 has a first end 205 and a second end 206, defining the upper and lower surfaces. The intersection of the first end 205 and the outer diameter of the first cylinder 201 may include step or notch 209. The first cylinder 201 has a height (e.g., distance between the first and second ends 205, 206) less than that of the substrate support 126. For example, the first cylinder 201 may have a height greater than about 0.25 inches (about 0.64 centimeter), for example between about 0.440 and about 0.420 inches (about 1.12 and about 1.07 cm), such that the first end 205 and substrate 105 are separated by a gap 251. The gap 251 electrically isolates the deposition ring 180 from the substrate 105 while minimizing the possibility for material to be deposited on a back side of the substrate 105. The notch 209 locally increases the gap 251 at the edge of the substrate. The gap 251 has a vertical distance "X" (e.g., distance between first end 205 and the substrate receiving surface 127) between about 0.001 inches (about 2.54 mm) to about 0.02 inches (about 50.80 mm), for example 0.007 inches (17.78 mm).

The second end 206 of the first cylinder 201 is coupled to a top surface 207 of the first annular ring 202 near an inner diameter of the first annular ring 202. The vertical distance "Y" between top surface 207 and first end 205 is between about 0.15 inches (about 0.38 centimeter) to about 1.0 inch (about 2.54 cm), for example 0.343 inches (0.87 centimeter). Increasing the vertical distance Y reduces the ground potential effect on the edge of the substrate 105 and creates better deposition uniformity. A first end 220 of the second cylinder 203 is coupled to a bottom surface 208 of the first annular ring 202 near an outer diameter of the first annular ring 202. A second end 210 of the second cylinder 203 is coupled to a top surface 211 of the second annular ring 204 near an inner diameter of the second annular ring 204. In one embodiment, all vertical or near vertical surfaces of the deposition ring 180 radially outward of the second cylinder 203 are greater than 0.25 inches (0.64 centimeter) vertically below the substrate receiving surface 127 of the substrate support 126 when the deposition ring 180 is positioned on the pedestal assembly 120.

In one embodiment, a distance between the first and second ends 205, 206 of the first cylinder 201 is at least half of a thickness of the substrate support 126. In another embodiment, the first cylinder 201 constitutes at least a third of the total thickness of the deposition ring 180 as defined between the first end 205 of the first cylinder 201 and a bottom surface 212 of the second annular ring 204.

In one embodiment, the bottom surface 208 of the first annular ring 202 may rest on a ledge of the base plate 128 while the bottom surface 212 of the second annular ring 204 maintains a spaced apart relationship with the base plate 128, as shown in FIG. 2A. In another embodiment, a cooling conduit 152 may disposed in the base plate 128, as shown in FIG. 2A. In another embodiment, the bottom surface 208 of the first annular ring 202 may rest on a ledge 217 extending radially outward from the substrate support 126 while the bottom surface 212 of the second annular ring 204 maintains a spaced apart relationship with the base plate 128, as shown in FIG. 2B. The ledge 217 may be positioned a vertical distance of 0.25 inches (0.64 centimeter) or greater, such as 0.40 inches (1.02 cm) or greater, from the substrate receiving surface 127 of the substrate support 126. The substrate support may have a thickness greater than 0.25 inches (0.64 centimeter), for example greater than 0.40 inches (1.02 cm). The thickness of the substrate support 126 is configured so that the top surface 207 of the first annular ring 202 is greater than 0.25 inches (0.64 centimeter), for example greater than 0.30 inches (0.76 centimeter), vertically from the substrate receiving surface 127 of the substrate support 126.

Returning to FIG. 2A, the top surface 211 of the second annular ring 204 includes a raised annular inner pad 213 separated from a raised annular outer pad 214 by a groove 215. The raised annular inner pad 213 extends further above the top surface 211 of the second annular ring 204 than the raised annular outer pad 214. The raised annular outer pad 214 supports the cover ring 170. A portion of the deposition ring 180 may be coated with an Al arc spray.

The deposition ring 180 and the cover ring 170 cooperate with one another to reduce formation of sputter deposits on the peripheral edges of the substrate support 126 and the overhanging edge of the substrate 105. The cover ring 170 has a top surface 172. The cover ring 170 encircles and at least partially covers the deposition ring 180 to receive, and thus, shadow the deposition ring 180 from the bulk of the sputtering deposits. The cover ring 170 is fabricated from a material that can resist erosion by the sputtering plasma, for example, a metallic material such as stainless steel, titanium or aluminum, or a ceramic material, such as aluminum oxide. In one embodiment, the cover ring 170 is composed of titanium having a purity of at least about 99.9 percent. In one embodiment, a surface of the cover ring 170 is treated with a twin-wire aluminum arc-spray coating, such as, for example, CLEANCOAT™, to reduce particle shedding from the surface of the cover ring 170.

The cover ring 170 includes a wedge 242 coupled to an annular body 245. The wedge 242 may include an inclined top surface 244 that is sloped radially inwards and encircles the substrate support 126. The wedge 242 may also include a projecting bulbous brim 250 which extends downward toward the raised annular inner pad 213. The projecting brim 250 reduces deposition of sputtering materials on the outer upper surface of the deposition ring 180.

The cover ring 170 further comprises a footing 252 extending downward from the inclined top surface 244 of the wedge 242, to rest upon the raised annular outer pad 214 of the deposition ring 180. In one embodiment, a dual-stepped surface is formed between the footing 252 and the lower surface of the projecting brim 250.

The cover ring 170 further comprises an inner cylindrical ring 254 and an outer cylindrical ring 256 that extend downwardly from the annular body 245 to define a gap therebetween that allows the rings 254, 256 to interleave with the ground shield 160. The inner and outer cylindrical rings 254 and 256 are located radially outward of the footing 252 of the annular wedge 242. The inner cylindrical ring 254 may have a height that is smaller than the outer cylindrical ring 256. Additionally, both rings 254, 256 extend below the footing 252. The cover ring 170 sits as far vertically below the substrate 105 as possible to mitigate the effects that the cover ring 170 may have on electric fields surrounding the substrate 105. The vertical distance "Z" between top surface 172 and first end 205 is between about 0.15 inches (about 0.38 centimeter) to about 1.0 inch (about 2.54 cm), for example 0.282 inches (0.72 centimeter). Increasing the vertical distance Z reduces the ground potential effect on the edge of the substrate 105 and creates better deposition uniformity.

The ground shield 160 has an inner wall 258. The horizontal distance "U" between the inner wall 258 and the edge of the substrate 105 is between about 1.80 inches (about 4.57 cm) to 4.5 inches (11.43 cm), for example 2.32 inches (5.89 cm). A space or gap 264 between the ground shield 160 and the cover ring 170 forms a convoluted S-shaped pathway or labyrinth to prevent plasma from traveling therethrough. The shape of the pathway is advantageous, for example, because it hinders and impedes ingress of plasma species into this region, reducing undesirable deposition of sputtered material.

Figure 2C:
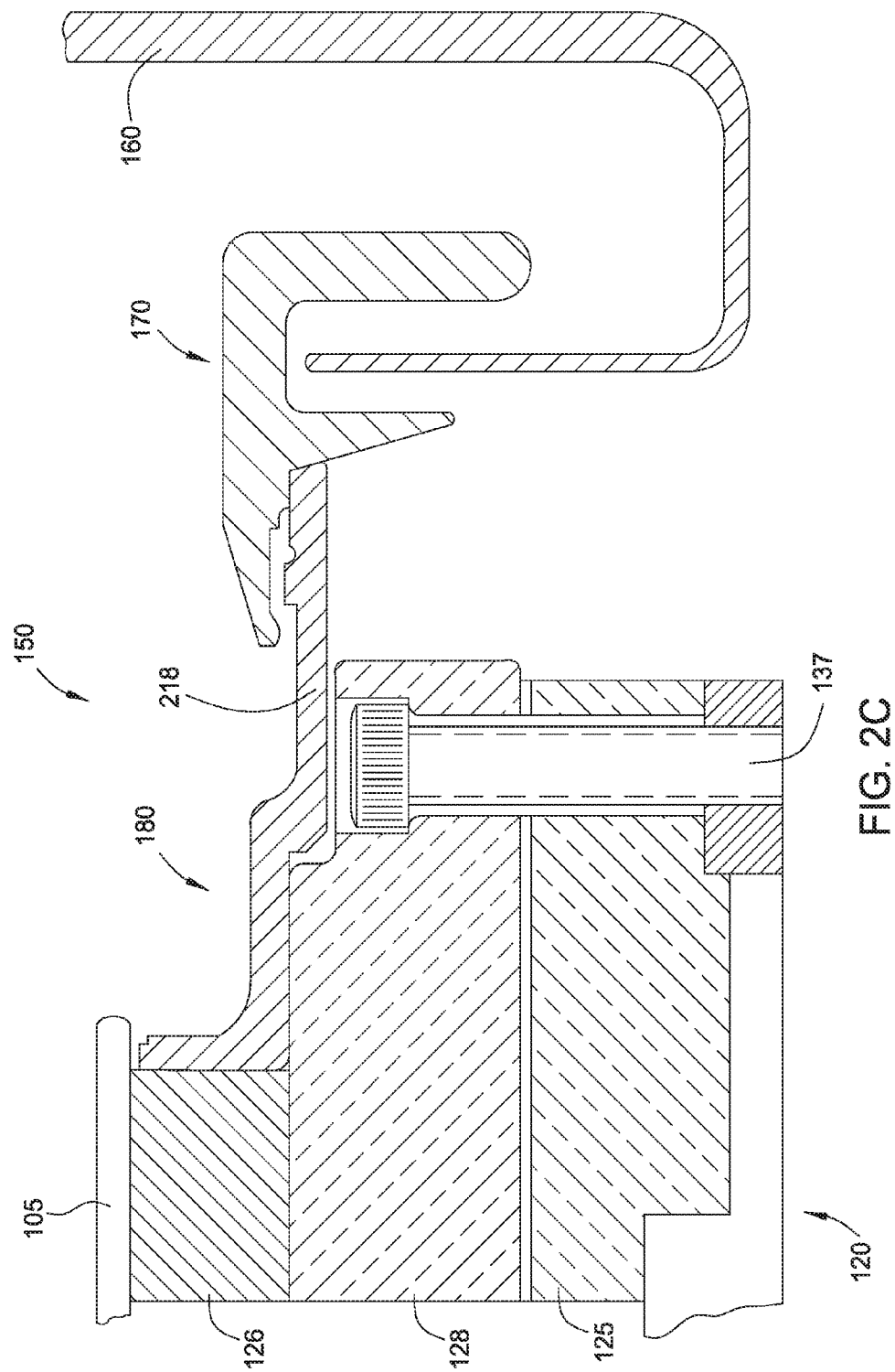
FIG. 2C illustrates a partial cross-section of another embodiment of a process kit.

In one embodiment, the inside diameter of the ground shield 160 may be increased to space the cover ring 170 farther away from the substrate 105, as shown in FIG. 2C. Spacing the cover ring 170 from the substrate 105 reduces the effects of the cover ring 170 on the electric fields near the substrate 105. The increased inside diameter of the ground shield 160 may increase the substrate 105 deposition uniformity between about 50% to about 75%. The components of the deposition ring 180 may extend outward by a greater radial distance to maintain optimum position of the cover ring 170, for example, a second annular ring 218 may have a greater radial length as compared to the second annular ring 204 such that the inside diameter of the cover ring 170 is located radially outward of the pedestal assembly 120.

Figure 3A:
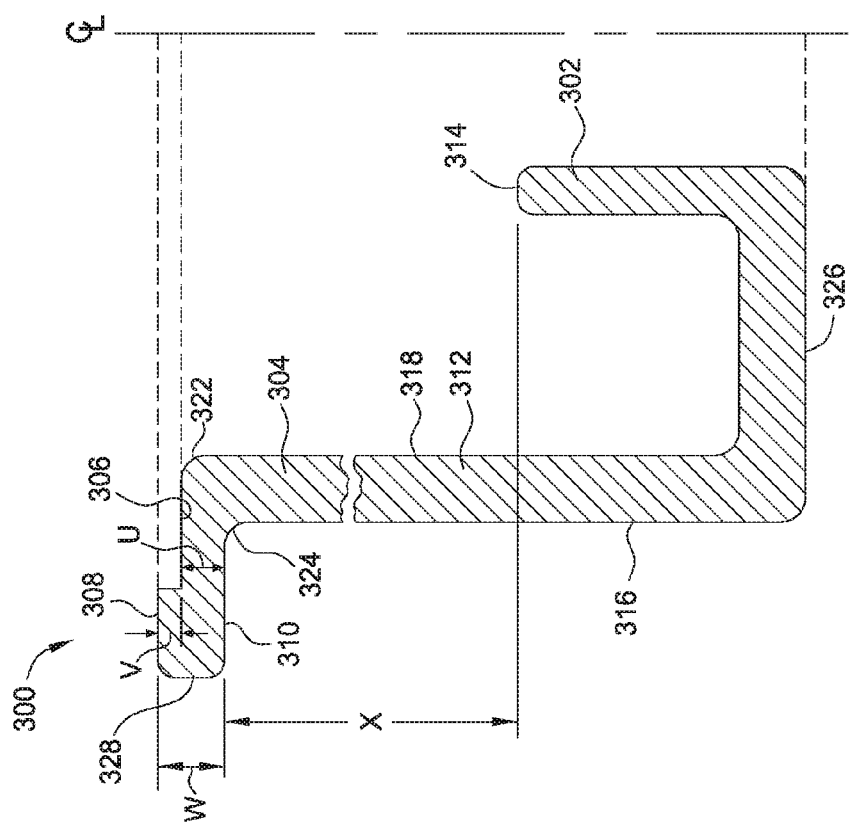
FIG. 3A illustrates a partial cross-section of an embodiment of a ground shield.

In one embodiment, the ground shield 160 of FIG. 2C may be a ground shield 300, as shown in FIG. 3A. The ground shield 300 has an inner cylindrical ring 302 and an outer cylindrical ring 304. The inner cylindrical ring 302 is connected to the outer cylindrical ring 304 by a base 326. The outer cylindrical ring 304 has a first top surface 306, a second top surface 308, a bottom surface 310, a first inner edge 322, and a first outer edge 324. The first inner edge 322 meets the first outer edge 324 with a radius between about 0.8 inches (about 2.03 cm) and 0.12 inches (0.30 centimeter), for example, 0.10 inches (0.25 centimeter). The first inner edge 322 is adjacent to the first top surface 306, and the first outer edge 324 is adjacent to the bottom surface 310. The inner cylindrical ring 302 has a top surface 314. The vertical distance "U" between the first top surface 306 and bottom surface 310 is between about 0.16 inches (about 0.41 centimeter) to about 0.20 inches (about 0.51 centimeter), for example 0.18 inches (0.46 centimeter). The vertical distance "V" between the first top surface 306 and the second top surface 308 is between about 0.02 inches (about 0.05 centimeter) to about 0.06 inches (about 0.15 centimeter), for example 0.04 inches (0.10 centimeter). The vertical distance "W" between the second top surface 308 and the bottom surface 310 is between about 0.20 inches (about 0.51 centimeter) to about 0.24 inches (about 0.61 centimeter), for example 0.22 inches (0.56 centimeter). The outer cylindrical ring body 312 has a thickness of between about 0.11 inches (about 0.28 centimeter) to about 0.15 inches (about 0.38 centimeter), for example 0.13 inches (0.33 centimeter). The vertical distance "X" between the top surface 314 of the inner cylindrical ring 302 and the bottom surface 310 of the outer cylindrical ring 304 is between about 6.22 inches (about 15.8 cm) to about 6.26 inches (about 15.9 cm), for example 6.24 inches (15.85 cm). The outer cylindrical ring 304 has a substantially vertical first outer wall 316 with an outer diameter between about 17.87 inches (about 45.39 cm) to about 17.91 inches (about 45.49 cm), for example 17.89 inches (45.44 cm). The outer cylindrical ring 304 has a second outer wall 328 and a substantially vertical inner wall 318. The substantially vertical inner wall 318 may be textured, for example by bead blasting or other suitable processes that may texture the substantially vertical inner wall 318. The substantially vertical inner wall 318 may also be sprayed with aluminum arc spray. The substantially vertical inner wall 318 meets the first inner edge 322, and the substantially vertical first outer wall 316 meets the first outer edge 324. The second outer wall 328 is adjacent to the bottom surface 310 and the second top surface 308.

Figure 3B:
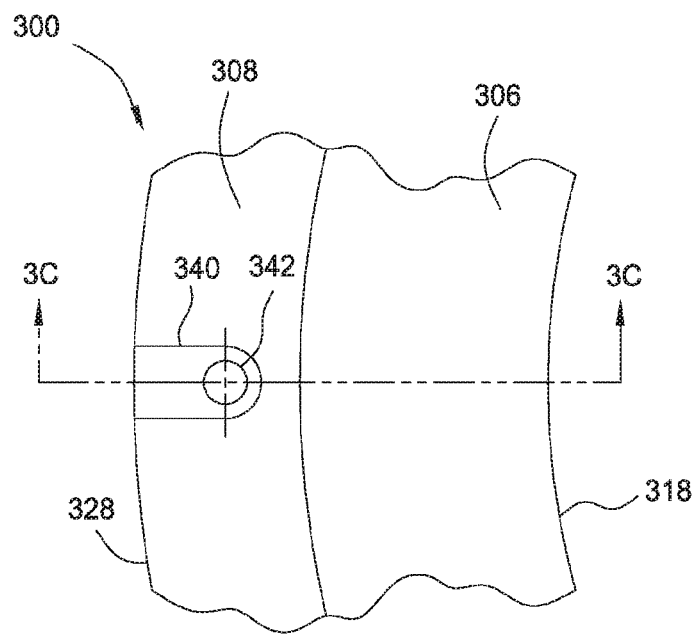
FIG. 3B illustrates a partial top view of FIG. 3A.
Figure 3C:
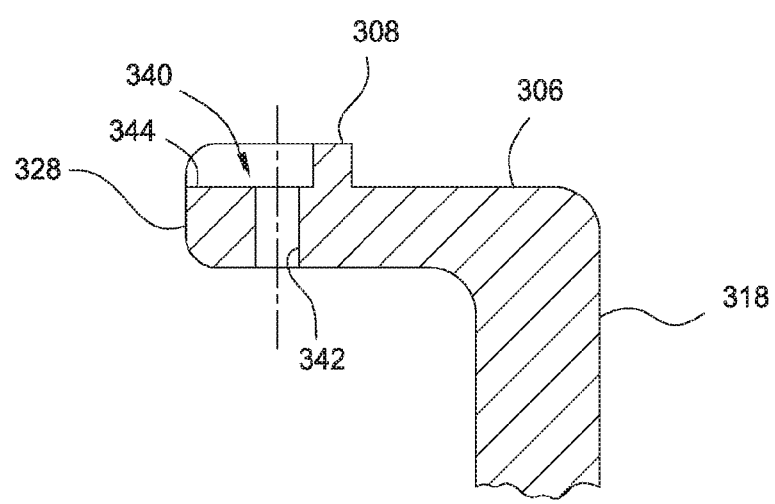
FIG. 3C illustrates a partial sectional view taken through the section line 3C-3C in FIG. 3B.

FIG. 3B is partial top view of FIG. 3A, and FIG. 3C is partial sectional view taken through the section line 3C-3C in FIG. 3B. The ground shield 300 has a notch 340 and a bolt 342 formed in a bottom surface of the notch 344. The bolt 342 is located in a polar array in the ground shield 300, with about 12 bolts 342 in the ground shield 300. The notch 340 may be formed by using an end mill or other suitable tools.

The components of the process kit 150 as described work alone and in combination to significantly reduce the effects on the electric fields near the edge of the substrate.

While the foregoing is directed to embodiments of the present invention, other and further embodiments of the invention may be devised without departing from the basic scope thereof, and the scope thereof is determined by the claims that follow.

What is claimed is:

1. A process kit for use in a substrate processing chamber, comprising:
    a deposition ring, comprising:
        a first cylinder having a first end and a second end;
        a first annular ring comprising:
            an inner diameter;
            an outer diameter;
            a top surface; and
            a bottom surface opposite the top surface, wherein the first annular ring is coupled to the second end of the first cylinder by a portion of the top surface adjacent the inner diameter of the first annular ring;
        a second cylinder coupled at a first end to a portion of the bottom surface adjacent the outer diameter of the first annular ring;
        a second annular ring comprising:
            an inner diameter;
            an outer diameter;
            a top surface including a raised annular outer pad adjacent the outer diameter of the second annular ring and a raised annular inner pad disposed radially inward of the raised annular outer pad, the raised annular inner pad separated from the raised annular outer pad by a groove; and
            a bottom surface opposite the top surface, wherein a portion of the top surface adjacent the inner diameter of the second annular ring is coupled to a second end of the second cylinder opposite the first end, and wherein a distance between the first and second ends of the first cylinder is at least a third of a distance between the first end of the first cylinder and the bottom surface of the second annular ring; and
    a cover ring, comprising:
        an annular body;
        a top surface;
        an inner cylindrical ring;
        an outer cylindrical ring;
        a wedge coupled to the annular body, comprising:
            an inclined top surface; and
            a projecting bulbous brim; and
        a footing.

2. The process kit of claim 1, wherein the inclined top surface of the wedge of the cover ring slopes radially inward.

3. The process kit of claim 1, wherein the raised annular outer pad and the raised annular inner pad of the deposition ring are not in a common plane.

4. The process kit of claim 1, wherein the first cylinder, the first annular ring, the second cylinder and the second annular ring of the deposition ring comprise a unitary structure.

5. The process kit of claim 1, wherein the first cylinder, the first annular ring, the second cylinder and the second annular ring of the deposition ring comprise a unitary structure.

6. The process kit of claim 1, wherein the first cylinder of the deposition ring has an inner wall having a diameter between about 11.615 inches and about 11.630 inches.

7. The process kit of claim 1, wherein the first cylinder of the deposition ring has an outside diameter between about 11.720 and about 11.890 inches.

8. The process kit of claim 7, wherein the first cylinder of the deposition ring has a height, defined between the first and second end, between about 0.440 inches and about 0.420 inches.

9. The process kit of claim 1, wherein the first cylinder of the deposition ring has a thickness between about 0.071 to about 0.625 inches.

10. The process kit of claim 1, wherein the first cylinder of the deposition ring constitutes at least a third of a total thickness of the deposition ring, as defined between the first end of the first cylinder and the bottom surface of the second annular ring.

11. The process kit of claim 1, wherein a portion of the deposition ring is coated with an Al arc spray.

12. The process kit of claim 1, wherein the footing of the cover ring is configured to rest upon the raised annular outer pad of the deposition ring.

13. The process kit of claim 1, wherein the deposition ring remaining surfaces of the deposition ring are disposed below the first end, wherein an outer diameter of the first cylinder of the deposition ring and the first end of the first cylinder of the deposition ring intersect at a notch.

\* \* \* \* \*